United States Patent
Wu

(10) Patent No.: US 8,912,293 B2
(45) Date of Patent: Dec. 16, 2014

(54) RESIN COMPOSITION, AND PREPEG AND LAMINATE PREPARED USING THE SAME

(75) Inventor: Hsin-Ho Wu, Chupei (TW)

(73) Assignee: Taiwan Union Technology Corporation, Chupei (TW)

( * ) Notice: Subject to any disclaimer, the term of this patent is extended or adjusted under 35 U.S.C. 154(b) by 274 days.

(21) Appl. No.: 13/240,264

(22) Filed: Sep. 22, 2011

(65) Prior Publication Data

US 2013/0011682 A1 Jan. 10, 2013

(30) Foreign Application Priority Data

Jul. 5, 2011 (TW) .............................. 100123627 A

(51) Int. Cl.

| | | |
|---|---|---|
| B32B 15/092 | (2006.01) | |
| B32B 27/04 | (2006.01) | |
| B32B 27/38 | (2006.01) | |
| C08L 63/00 | (2006.01) | |
| C08L 63/04 | (2006.01) | |
| C08G 59/14 | (2006.01) | |
| C08K 3/36 | (2006.01) | |
| C08K 3/40 | (2006.01) | |
| H05K 1/03 | (2006.01) | |
| C08G 59/40 | (2006.01) | |
| C08G 59/50 | (2006.01) | |
| C08G 59/68 | (2006.01) | |
| B32B 15/20 | (2006.01) | |
| A61K 31/53 | (2006.01) | |
| A61K 31/536 | (2006.01) | |
| C07D 265/14 | (2006.01) | |
| C07D 403/14 | (2006.01) | |
| C07D 413/14 | (2006.01) | |
| C08K 3/34 | (2006.01) | |

(52) U.S. Cl.
CPC .............. *B32B 15/092* (2013.01); *C08G 59/14* (2013.01); *C08K 3/36* (2013.01); *C08K 3/40* (2013.01); *C08L 63/00* (2013.01); *H05K 1/0326* (2013.01); *C08G 59/4021* (2013.01); *C08G 59/5086* (2013.01); *C08G 59/686* (2013.01); *B32B 15/20* (2013.01); *C08K 3/34* (2013.01); *B32B 2255/02* (2013.01)
USPC ............. 525/510; 428/418; 442/59; 442/150; 525/503; 544/196; 544/198

(58) Field of Classification Search
None
See application file for complete search history.

(56) References Cited

U.S. PATENT DOCUMENTS 7,781,561 B2 8/2010 Lin et al.
8,299,244 B1 * 10/2012 Wu ................................ 544/198

FOREIGN PATENT DOCUMENTS

TW 201122057 7/2011

OTHER PUBLICATIONS

Schott "Pyran Platinum," 2014, 20 pages.*
Wikipedia, "Pyran," Aug. 17, 2014, one page.*
Subrayan et al., "Condensation of Substituted Phenols with Hexakis (methoxymethyl) melamine: Synthesis, Characterization, and Properties of Substituted 2, 4, 6-Tris [3, 4-dihydro-1, 3-(2H)-benzoxazin-3-yl]-s-triazine Derivatives", Chem. Matter, vol. 10, 1998, American Chemical Society, Michigan, pp. 3506-3512.

* cited by examiner

*Primary Examiner* — Robert Sellers
(74) *Attorney, Agent, or Firm* — Grossman, Tucker, Perreault & Pfleger, PLLC

(57) ABSTRACT

A resin composition is provided. The resin composition comprises:
  an epoxy resin;
  a hardener, which comprises a melamine compound of Formula I:

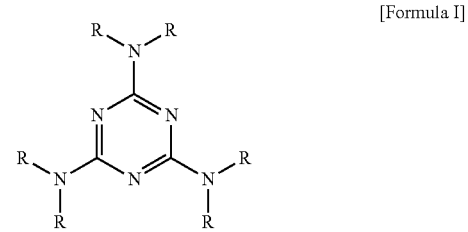

[Formula I]

wherein,
R is the same with or different from each other and has the formula of

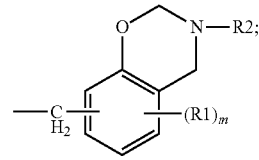

R1 and R2 are individually selected from a group consisting of H, a halogen, a substituted or unsubstituted C1-C15 alkyl group, a substituted or unsubstituted C1-C15 aloxy group, a substituted or unsubstituted C3-C15 cycloalkyl group, a substituted or unsubstituted C6-C20 aryl group, a substituted or unsubstituted C6-C20 aryloxy group, a substituted or unsubstituted C1-C15 unsaturated hydrocarbyl group, a naphthol group, a phenanthrenol group, and a dicyclopentadiene group, with a proviso that R2 is not H; and
m is 1 or 2,
wherein the amount of the hardener is about 20 parts by weight to about 150 parts by weight per 100 parts by weight of the epoxy resin.

10 Claims, 3 Drawing Sheets

RESIN COMPOSITION, AND PREPEG AND LAMINATE PREPARED USING THE SAME

This application claims priority to Taiwan Patent Application No. 100123627 filed on Jul. 5, 2011.

CROSS-REFERENCES TO RELATED APPLICATIONS

Not applicable.

BACKGROUND OF THE INVENTION

1. Field of the Invention

The present invention relates to a resin composition. Specifically, the present invention relates to an epoxy resin composition containing a melamine compound as a hardener, and a prepreg and laminate prepared using the same.

2. Descriptions of the Related Art

Printed circuit boards (PCBs) are circuit substrates that are used for electronic devices to load other electronic components and to electrically connect the components to provide a stable circuit working environment. One kind of a conventional printed circuit board is a copper clad laminate (CCL), which is primarily composed of resin(s), substrate(s) such as reinforcing material(s) and copper foil(s). Conventional resins include such as epoxy resins, novolac resins, polyamine formaldehyde resins, silicone resins or polytetrafluoroethylene resins; and conventional reinforcing materials include such as glass fiber cloths, glass fiber mats, insulating papers or linen cloths.

Considering the subsequent electronic processes, properties such as heat resistance, size stability, chemical stability, workability, toughness, and mechanical strength, etc. should be taken into consideration during the preparation of the printed circuit board. Generally, printed circuit broads prepared by using an epoxy resin can properly meet the above requirements. Hence, epoxy resins are those most commonly used in this field. However, printed circuit broads prepared by using an epoxy resin are usually provided with a high dielectric constant (Dk) value and a high dissipation factor (Df) value, which are disadvantageous for signal transmission. Specifically, because the signal transmission rate is in inverse proportion to the square root of Dk, the higher the Dk value, the lower the signal transmission rate; and due to the material resistance, the higher the Df value the higher the signal lost in the laminate. Therefore, the industry is committed to provide a laminate with good physicochemical properties and low Dk and Df values.

It is known that N,O-heterocyclic compounds with a

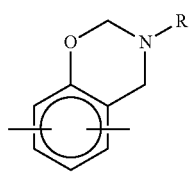

structure can be used as a hardener to regulate epoxy resin. Due to the high proportion of benzene rings and C—N bonds in the structure, the N,O-heterocyclic compounds possess excellent physicochemical properties (such as a good thermal resistance, a high glass transition temperature, an outstanding flammability and a good solubility for organic solvents). In addition, the polymer prepared from a ring-opening polymerization of N,O-heterocyclic compounds has a large number of hydroxyl groups in its structure and can further react with an epoxy resin to provide a final product with improved thermal and mechanical properties. For example, U.S. Pat. No. 7,781,561 discloses a method for manufacturing an N,O-heterocyclic compound with a

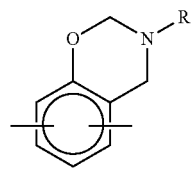

structure, wherein a melamine compound with three

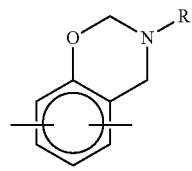

structures is synthesized with the utilization of a melamine.

The present invention provides a resin composition for preparing a laminate. The resin composition has a good solubility for organic solvents and thus, is convenient for application. The laminate prepared using the resin composition is provided with outstanding physicochemical properties (such as a high glass transition temperature, a good moisture resistance, a low coefficient of thermal expansion, and a good solubility for organic solvents), and electrical properties (low Df and Dk values).

SUMMARY OF THE INVENTION

An aspect of the present invention is to provide a resin composition comprising:
  an epoxy resin; and
  a hardener comprising a melamine compound of Formula I:

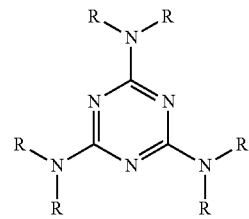

[Formula I]

wherein,
R is the same with or different from each other and has the formula of

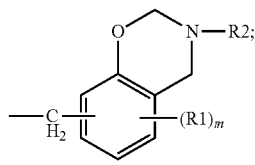

R1 is independently selected from a group consisting of H, a halogen, a substituted or unsubstituted C1-C15 alkyl, a substituted or unsubstituted C1-C15 alkoxy, a substituted or unsubstituted C3-C15 cycloalkyl, a substituted or unsubstituted C6-C20 aryl, a substituted or unsubstituted C6-C20 aryloxy, a substituted or unsubstituted C1-C15 unsaturated hydrocarbyl, a naphthol group, a phenanthrenol group, and a dicyclopentadiene group;

R2 is selected from a group consisting of a halogen, a substituted or unsubstituted C1-C15 alkyl, a substituted or unsubstituted C1-C15 alkoxy, a substituted or unsubstituted C3-C15 cycloalkyl, a substituted or unsubstituted C6-C20 aryl, a substituted or unsubstituted C6-C20 aryloxy, a substituted or unsubstituted C1-C15 unsaturated hydrocarbyl, a naphthol group, a phenanthrenol group, and a dicyclopentadiene group; and m is 1 or 2, wherein the amount of hardener is about 20 parts by weight to about 150 parts by weight per 100 parts by weight of the epoxy resin.

Another aspect of the present invention is to provide a prepreg, which is prepared by immersing a substrate into the above resin composition and drying the immersed substrate.

Yet another aspect of the present invention is to provide a laminate comprising a synthetic layer and a metal layer, wherein the synthetic layer is made from the above prepreg.

To render the above objects, technical features and advantages of the present invention more apparent, the present invention will be described in detail with reference to some embodiments hereinafter.

DETAILED DESCRIPTION OF THE INVENTION

Figure 1:
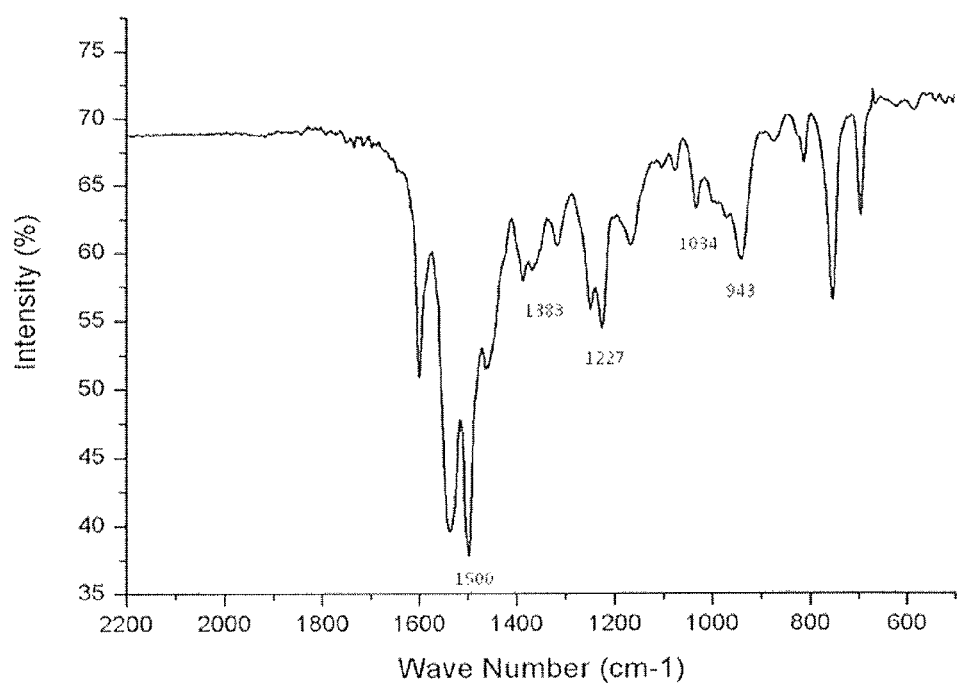
FIG. 1 shows the IR spectrum of the melamine compound contained in the resin composition of the present invention illustrated in the examples.

The following will describe some embodiments of the present invention in detail. However, without departing from the spirit of the present invention, the present invention may be embodied in various embodiments and should not be limited to the embodiments described in the specification. In addition, unless it is additionally explained, the expressions "a," "the," or the like recited in the specification (especially in the claims) should include the singular and the plural forms.

The resin composition of the present invention features using a hardener comprising a melamine compound. Due to the high proportion of benzene rings and C—N bonds in the structure (six

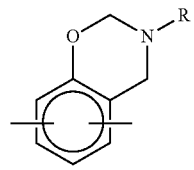

structures per molecule), the melamine compound possesses excellent physicochemical properties (such as thermal resistance, moisture resistance and electrical property). Thus, the polymer prepared from a ring-opening polymerization of the melamine compound has a larger number of hydroxyl groups and can further react with an epoxy resin to improve the physicochemical and electrical properties of the final products.

Specifically, the invention provides a resin composition comprising an epoxy resin and a hardener comprising a melamine compound of Formula I:

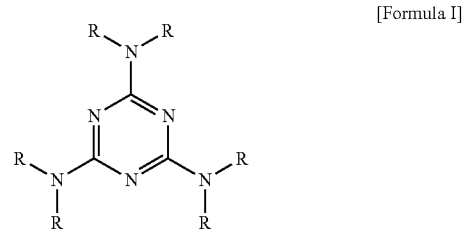

[Formula I]

wherein, R is the same with or different from each other and has the formula of

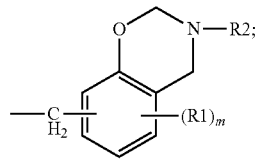

R1 is independently selected from a group consisting of H, a halogen, a substituted or unsubstituted C1-C15 alkyl, a substituted or unsubstituted C1-C15 alkoxy, a substituted or unsubstituted C3-C15 cycloalkyl, a substituted or unsubstituted C6-C20 aryl, a substituted or unsubstituted C6-C20 aryloxy, a substituted or unsubstituted C1-C15 unsaturated hydrocarbyl, a naphthol group, a phenanthrenol group, and a dicyclopentadiene group; R2 is selected from a group consisting of a halogen, a substituted or unsubstituted C1-C15 alkyl, a substituted or unsubstituted C1-C15 alkoxy, a substituted or unsubstituted C3-C15 cycloalkyl, a substituted or unsubstituted C6-C20 aryl, a substituted or unsubstituted C6-C20 aryloxy, a substituted or unsubstituted C1-C15 unsaturated hydrocarbyl, a naphthol group, a phenanthrenol group, and a dicyclopentadiene group; and m is 1 or 2. For example, R1 and R2 may be independently methyl, ethyl, propyl, butyl, methoxyl, ethoxyl or a substituted or unsubstituted phenyl or phenoxy group. The term "substituted" here means that H is substituted by a substituent which can be any groups or atoms other than "H." For example, the substituent may be a halogen (such as F or Cl), a hydroxyl, a cyano, a carboxyl, an alkyl, an epoxy or an alkoxy. Without being limited by any theories, it is believed that the higher the proportion of benzene rings and unsaturated bonding in the melamine compound, the better the thermal and the mechanical and chemical properties of the final product. Thus, R1 and R2 are preferably independently a substituted or unsubstituted C6-C20 aryl, a substituted or unsubstituted C6-C20 aryloxy, a substituted or unsubstituted C1-C15 unsaturated hydrocarbyl, a naphthol group, a phenanthrenol group, or a dicyclopentadiene group. In some embodiments of the present invention, R is the same with each other, R1 is H and R2 is a substituted or unsubstituted phenyl group.

The melamine compound of Formula I may be prepared by the following method:
(a) reacting melamine with formaldehyde under a basic condition to provide a first solution;
(b) reacting the first solution with a phenolic compound of Formula Ia to provide a first intermediate:

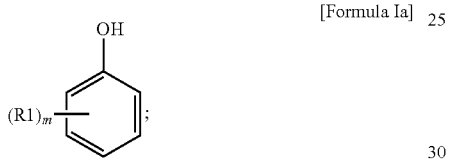

and
(c) reacting the first intermediate with formaldehyde and a primary amine with a general formula of NH$_2$R2 to obtain the melamine compound.

Without being limited by any theories, it is believed that the following reaction is performed in step (a) to provide the first solution comprising compound A:

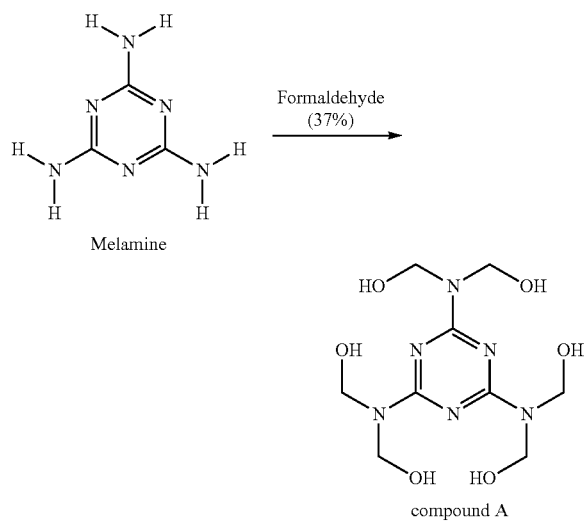

The above reaction must be carried out in a basic condition (preferably at a pH value ranging from about 8 to about 10) and at a temperature ranging from about 50° C. to about 75° C. It is disadvantageous to the yield of compound A if the pH value is unduly high (such as >10) or the temperature goes beyond the preferred range. In some embodiments of the present invention, when preparing the melamine compound of Formula I, step (a) is carried out at about 60° C. to about 65° C. and at a pH value ranging from about 8 to about 9.

Without being limited by any theories, it is believed that OH group of compound A reacts with the phenolic compound of Formula Ia in step (b) to perform a dehydration reaction to form the first intermediate, as shown in the following equation:

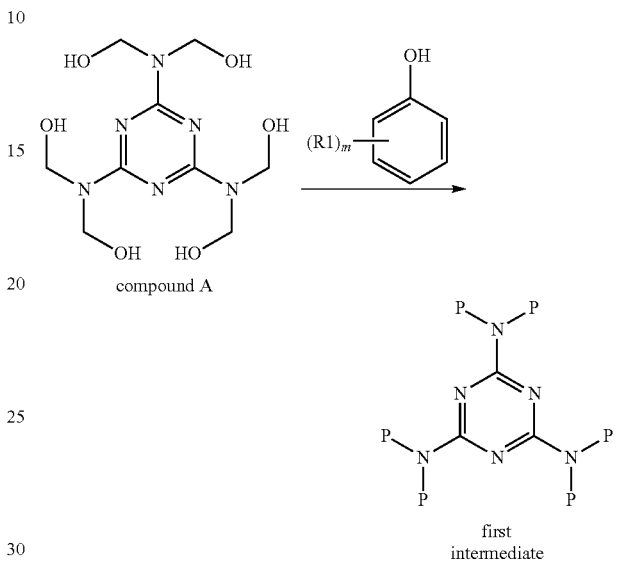

wherein, P is

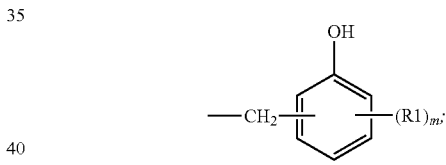

R1 is independently selected from a group consisting of H, a halogen, a substituted or unsubstituted C1-C15 alkyl, a substituted or unsubstituted C1-C15 alkoxy, a substituted or unsubstituted C3-C15 cycloalkyl, a substituted or unsubstituted C6-C20 aryl, a substituted or unsubstituted C6-C20 aryloxy, a substituted or unsubstituted C1-C15 unsaturated hydrocarbyl, a naphthol group, a phenanthrenol group, and a dicyclopentadiene group; and m is 1 or 2. For example, R1 may be methyl, ethyl, propyl, butyl, methoxyl, ethoxyl or a substituted or unsubstituted phenyl or phenoxy group. Without being limited by any theories, it is believed that the higher the proportion of benzene rings and unsaturated bonding in the melamine compound, the better the thermal and the mechanical and chemical properties of the final product. Thus, R1 is preferably a substituted or unsubstituted C6-C20 aryl, a substituted or unsubstituted C6-C20 aryloxy, a substituted or unsubstituted C1-C15 unsaturated hydrocarbyl, a naphthol group, a phenanthrenol group, or a dicyclopentadiene group.

To raise the yield of the melamine compound, it is preferred that the pH value of the first solution be adjusted to neutral prior to step (b) and that step (b) is carried out at a temperature ranging from about 80° C. to about 95° C. Optionally, a purifying step and drying step may be carried out after step (b) to extract the first intermediate to improve the purity of the first intermediate and to obtain a melamine compound with better quality after step (c). For example, in some embodiments of the present invention, the method for preparing the melamine compound of Formula I comprises adjusting the pH value of the first solution to neutral by using phosphoric acid; carrying out the reaction of step (b) at about 95° C.; mixing the product of step (b) with water to form an emulsion; and purifying the emulsion by MEK/Water and drying the emulsion to obtain the first intermediate, a white solid product.

Without being limited by any theories, it is believed that the phenyl of the first intermediate is reacted with formaldehyde and the primary amine in step (c) to form the melamine compound of the present invention, as shown in the following reaction:

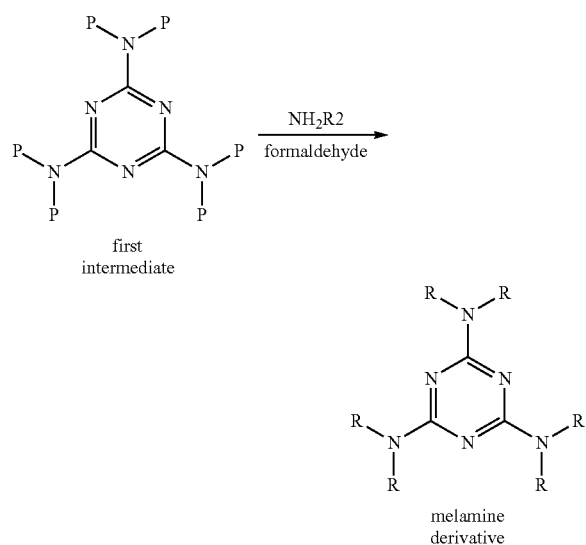

wherein, P and R are as defined above; R2 is selected from a group consisting of a halogen, a substituted or unsubstituted C1-C15 alkyl, a substituted or unsubstituted C1-C15 alkoxy, a substituted or unsubstituted C3-C15 cycloalkyl, a substituted or unsubstituted C6-C20 aryl, a substituted or unsubstituted C6-C20 aryloxy, a substituted or unsubstituted C1-C15 unsaturated hydrocarbyl, a naphthol group, a phenanthrenol group, and a dicyclopentadiene group; and m is 1 or 2. For example, R2 may be methyl, ethyl, propyl, butyl, methoxyl, ethoxyl or a substituted or unsubstituted phenyl or phenoxy group. Without being limited by any theories, it is believed that the higher the proportion of benzene rings and unsaturated bonding in the melamine compound, the better the thermal, mechanical and chemical properties of the final product. Thus, R2 is preferably a substituted or unsubstituted C6-C20 aryl, a substituted or unsubstituted C6-C20 aryloxy, a substituted or unsubstituted C1-C15 unsaturated hydrocarbyl, a naphthol group, a phenanthrenol group, or a dicyclopentadiene group.

Furthermore, to raise the yield of the melamine compound of the present invention, step (c) is preferably carried out in the following manner:
mixing the first intermediate with the solvent and the primary amine with a general formula of NH$_2$R2 to provide a first reaction mixture;
adding formaldehyde into the first reaction mixture and carrying out a reaction at a temperature ranging from about 80° C. to about 95° C. to obtain a solution containing the melamine compound; and
purifying and drying the solution to obtain the melamine compound.

For example, in some embodiments of the present invention, when preparing the melamine compound, the first intermediate and aniline were dissolved into a solvent such as dioxane to provide the first reaction mixture, and formaldehyde was then added dropwise into the first reaction mixture. The resultant mixture was heated to about 90° C. and maintained to carry out the reaction. After the reaction is completed, the solvent was removed by vacuum concentration to obtain the crude product of melamine compound. The crude product was then purified by MEK/DI-water and dried to obtain the melamine compound of Formula I. The solvent here should be an inert solvent which does not affect the reaction. And if the primary amine is in the form of a liquid at room temperature, the solvent may not be used. For example, the solvent may be an inert solvent selected from a group consisting of dioxane, toluene, xylene, N,N-dimethyl formamide (DMF), N,N-dimethyl acetamide (DMAc), dimethyl sulfoxide (DMSO) and combinations thereof.

According to the resin composition of the present invention, the epoxy resin contained is a resin with at least two epoxide groups in the molecular structure, such as a novolac epoxy resin, a high bromine epoxy resin, a phosphorus-containing epoxy resin, etc. In some embodiments of the present invention, a high bromine epoxy resin (Hexion 523) and a phosphorus-containing epoxy resin (Kolon5138) are illustrated as the epoxy resin, in the following examples According to the resin composition of the present invention, the hardener may be substantially composed of the melamine compound of Formula I, or of a mixture of the melamine compound of Formula I and other conventional hardener(s). The "conventional hardener" here is not particularly limited and may be selected from a group consisting of dicyandiamide (Dicy), 4,4'-diaminodiphenyl sulfone (DDS), novolac resin, and combinations thereof. The amount of hardener can be adjusted depending on the users' needs. Generally, the amount of the hardener is preferably about 20 parts by weight to about 150 parts by weight per 100 parts by weight of the epoxy resins, more preferably 40 parts by weight to about 90 parts by weight per 100 parts by weight of the epoxy resins, but not limited thereto. Moreover, in the embodiment where the hardeners including the melamine compound of Formula I and other conventional hardener(s), the ratio between the conventional hardener and the melamine compound of Formula I is not limited, and can be adjusted depending on the users' needs. In some embodiments of the present invention, the amount of hardener is composed of about 80 parts by weight or 50 parts by weight of a melamine compound of Formula I per 100 parts by weight of the epoxy resin, or of a mixture of about 35 parts by weight of the melamine compound and about 15 parts by weight of novolac resin per 100 parts by weight of the epoxy resin.

The resin composition in the present invention may further comprise other additives, such as a hardening promoter, a dispersing agent (i.e., a silane coupling agents), a mold-release agent, a flame retardant, a flexibilizer, etc. The additives may be used alone or in combination. For example, a hardening promoter selected from a group consisting of 2-methyl-imidazole (2MI), 2-ethyl-4-methyl-imidazole (2E4MI), 2-phenyl-imidazole (2PI) and combinations thereof, but not limited thereto, may be added to provide an improved hardening effect. The amount of the hardening promoter is generally about 0.01 parts by weight to about 1 part by weight per 100 parts by weight of the epoxy resin, and can be adjusted depending on the users' needs. Also, filler selected from a group consisting of silicon dioxide, glass powder, talcum, kaolin, mica and combinations thereof, but not limited thereto, may be added to improve the properties of the epoxy resin such as the processability, flammability, thermal resistance and moisture resistance. The amount of filler is generally about 0.01 parts by weight to about 80 parts by weight per 100 parts by weight of the epoxy resin, and can be adjusted depending on the users' needs.

The resin composition of the present invention may be prepared into varnish form by evenly mixing the epoxy resin, the melamine compound (as a hardener) and filler (optionally) through a stirrer; and dissolving or dispersing the mixture into a solvent, for subsequent applications. The melamine compound has a good solubility in organic solvents and thus can improve the dispersibility of a varnish of resin composition (dispersed more uniformly) and facilitate the preparation of the varnish.

The present invention further provides a prepreg which is prepared by immersing a substrate (a reinforcing material) into a varnish from the resin composition of the present invention and drying the immersed substrate under appropriate drying conditions. A conventional substrate such as reinforcing material includes a glass fiber cloth (a glass fiber fabric, a glass fiber paper, a glass fiber mat, etc.), a kraft paper, a short fiber cotton paper, a nature fiber cloth, an organic fiber cloth, etc. In some embodiments of the present invention, 7628 glass fiber cloths are illustrated as the reinforcing materials, and the reinforcing materials are heated and dried at 180° C. for 2 to 10 minutes (B-stage) to provide prepregs in a half-hardened state.

The present invention also provides a laminate comprising a synthetic layer and a metal layer, wherein the synthetic layer is made from the above half-hardened prepregs. Wherein, the laminate may be prepared by the following process: superimposing a plurality of prepregs and superimposing a metal foil (such as copper foil) on at least one external surface of the superimposed prepregs to provide a superimposed object; performing a hot-pressing operation onto the object to obtain the laminate. Moreover, a printed circuit board can be obtained by patterning the metal foil of the laminate.

The present invention will be further illustrated by the embodiments hereinafter, wherein the measuring instruments and methods are respectively as follows:

[Nuclear Magnetic Resonance (NMR) Analysis]
NMR spectrometer of Variun company (model No.: Mercury-VX200 MHz).

[Infrared Spectroscopic Analysis]
Infrared spectrometer of Bio-RAD company (model No.: FTS-3000).

[Differential Scanning Calorimetry (DSC) Analysis]
Differential scanning calorimeter of Perkin-Elmer company (model No.: DSC 7).

[Gel Permeation Chromatography (GPC) Analysis]
Gel permeation chromatography analyzer of Waters company (model No.: waters 600).

[Glass Transition Temperature (Tg) Test]
The glass transition temperature is measured by a dynamic mechanical analyzer (DMA), wherein the measuring regulations are IPC-TM-650.2.4.25C and 24C testing method of Institute for Interconnecting and Packaging Electronic Circuits (IPC).

[Dielectric Constant (Dk) and Dissipation Factor (Df) Measurement]
Dk and Df are measured according to ASTM D150 under an operating frequency of 1 GHz.

[$H_2O$ Absorption Test]
The $H_2O$ absorption of the laminate is tested by a pressure cooker test (PCT), i.e., subjecting the laminate into a pressure container (121° C., 100% R.H. and 1.2 atm) for 2 hrs.

[Coefficient of Thermal Expansion (CTE) Test and z-Axis Expansion Percentage (%) Test]
The through-thickness CTE (in z-axis direction) and the z-axis expansion % of the sample (a laminate in a size of 3 $mm^2$) are tested by the thermal expansion analyzer of TA instrument company (model No.: TA 2940) between a temperature gap ranging from about 50° C. to 260° C. (heating rate: 5° C./min)

[Thermal Decomposition Temperature Test]
The thermal decomposition temperature test is carried out by measuring the mass loss of the sample with a thermogravimetric analyzer (TGA). The temperature where the weight loss is up to 5% is regarded as the thermal decomposition temperature.

[Toughness Test]
The method for testing the toughness comprises the following steps: laying the laminate on a plane fixture; vertically placing a cross metal jig to come into contact with the surface of the laminate while applying a vertically-applied pressure to the cross metal jig; removing the cross metal jig; and observing the cross trace on the laminate. The laminate without any white embossing lines is regarded as having a good toughness, the one with slight white embossing lines is regarded as having a normal toughness, and the one with cracks or ruptures is regarded as having a poor toughness.

[Flammability Test]
The flammability test is carried out according to UL94V (Vertical Burn), which comprises the burning of a laminate, which is held vertical, using a Bunsen burner to exam its self-extinguished properties. The result is classified from UL94V-0 (the best) to UL94V-2.

EXAMPLES

The Preparation of the Melamine Compound

Melamine 126 g (1 mole) and 37% formaldehyde 487.0 g (6 moles) were placed in a 5 liter reactor, which was equipped with a stirrer and a condenser, and uniformly mixed to obtain a mixture. The pH of the mixture was adjusted to about 8 to about 9 by a 10% NaOH solution. The mixture was then heated and stirred to about 60° C. to about 65° C. and maintained for 40 minutes to complete the displacement reaction to form the first solution. The first solution was cooled down to room temperature and neutralized by an 85% $H_3PO_4$ solution.

Phenol 2820 g (30 moles) and 0.001 mole p-toluene sulfonic acid (pTSA) were added to the first solution. The resultant mixture is then heated and stirred to about 95° C. and maintained for 24 hours. Thereafter, the reactor was cooled down to room temperature and 5 liters DI-water was poured thereinto. After stirring for a few hours, the colloidal crude product of the first intermediate was obtained. The colloidal crude product was then washed with DI-water for few times, purified by MEK/DI-water, and filtered and dried to obtain a white solid of the first intermediate.

760 g (1 mole) first intermediate, 558 g (6 moles) aniline and 2000 ml dioxane were placed into a 5 liter reactor, which was equipped with a stirrer and a condenser, and uniformly mixed to obtain a mixture. The mixture was maintained at about 0° C. to about 5° C. while 974 g (12 moles) 37% formaldehyde was added dropwise to the mixture. Thereafter, the mixture was heated and stirred to about 90° C. and maintained for 24 hours. Then, the solvent was removed through a rotary evaporator to obtain a light yellow crude product. The crude product was purified by MEK/DI-water to obtain the light yellow product of melamine compound A.

The Proton NMR spectra ($d_6$-DMSO) of melamine compound A shows the characteristic signal of benzoxazine at about 4.5 and about 5.4 ppm, and the aromatic protons around about 6.5 to about 8.0 ppm.

As shown in FIG. 1, which shows the IR spectrum of melamine compound A, there are characteristic absorptions of the —COC— group at about 1034 $cm^{-1}$ and about 1227 $cm^{-1}$, —CNC— group at about 1383 cm-1, and the absorption at about 943 $cm^{-1}$ and about 1500 $cm^{-1}$ are attributed to a tri-substituted benzene ring.

Figure 2:
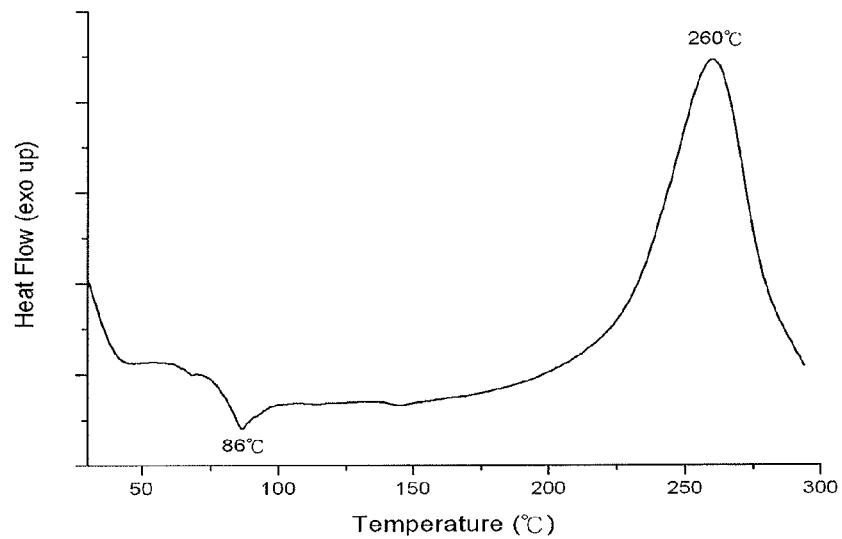
FIG. 2 shows the differential scanning calorimetry (DSC) analysis result of the melamine compound contained in the resin composition of the present invention illustrated in the examples.

As shown in FIG. 2, which shows the DSC analysis (scan rate: 20° C./min) result of melamine compound A, the melting point of melamine compound A is about 86° C. and the temperature of the ring-open reaction of melamine compound A is about 260° C.

Figure 3:
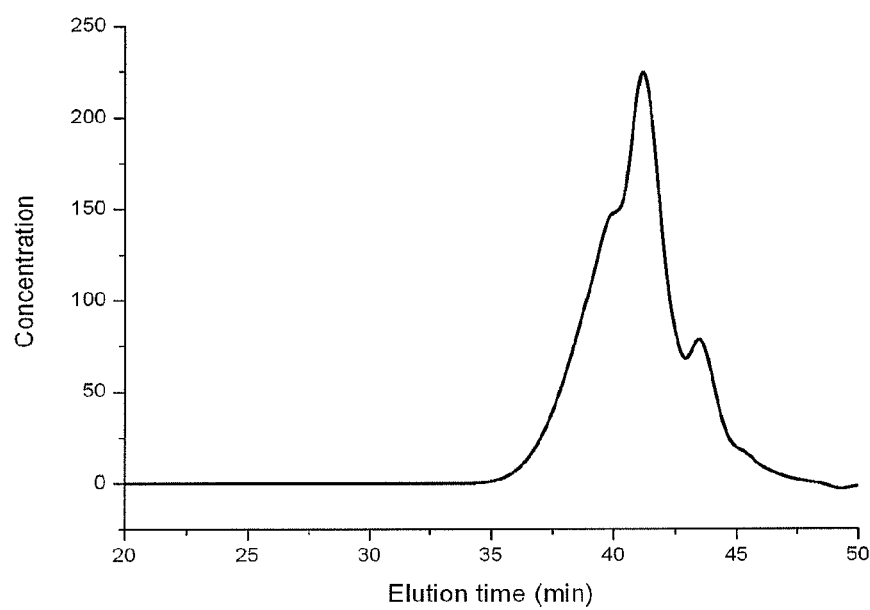
FIG. 3 shows the gel permeation chromatography (GPC) analysis result of the melamine compound contained in the resin composition of the present invention illustrated in the examples.

As shown in FIG. 3, which shows the GPC analysis result of melamine compound A, the weight-average molecular weight (Mw) of melamine compound A is about 1872 and the number-average molecular weight (Mn) of melamine compound A is about 1243 (polydispersity=1.50; elution solvent: THF).

The Preparation of the Resin Composition

Example 1

According to the ratio indicated in Table 1, phosphorus-containing epoxy resin (Kolon5138), melamine compound A (as a hardener), and 2-ethyl-4-methyl-imidazole (2E4MI, Aldrich) were uniformly mixed under room temperature with a stirrer for about 60 minutes, and then MEK was added. After stirring the resultant mixture under room temperature for another 120 minutes, resin composition 1 was obtained.

Example 2

The preparation procedures of Example 1 were repeated to prepare resin composition 2, except that the phosphorus-containing epoxy resin was replaced by about 100 parts by weight of high bromine epoxy resin (Hexion 523) and the amount of melamine compound A was adjusted to about 80 parts by weight.

Example 3

The preparation procedures of Example 2 were repeated to prepare resin composition 3, except that the hardener (80 parts by weight of melamine compound A) was replaced by a mixture of about 35 parts by weight of melamine compound A and about 15 parts by weight of novolac resin (PN, Hexion phenol novolac OH ew: 105-110).

Example 4

The preparation procedures of Example 3 were repeated to prepare resin composition 4, except that 20 parts by weight of aluminum hydroxide (ATH, Showa Denko, as filler) and about 0.2 parts by weight of silane coupling agent (Dow Corning Z-6040, as a dispersing agent) were additionally added.

Comparative Example 1

The preparation procedures of Example 1 were repeated to prepare comparative resin composition 1, except that the hardener (50 parts by weight of melamine compound A) was replaced by about 50 parts by weight of benzoxazine (Kuen Bong, type: 630).

[The Preparation of the Laminate]

Figure 4:
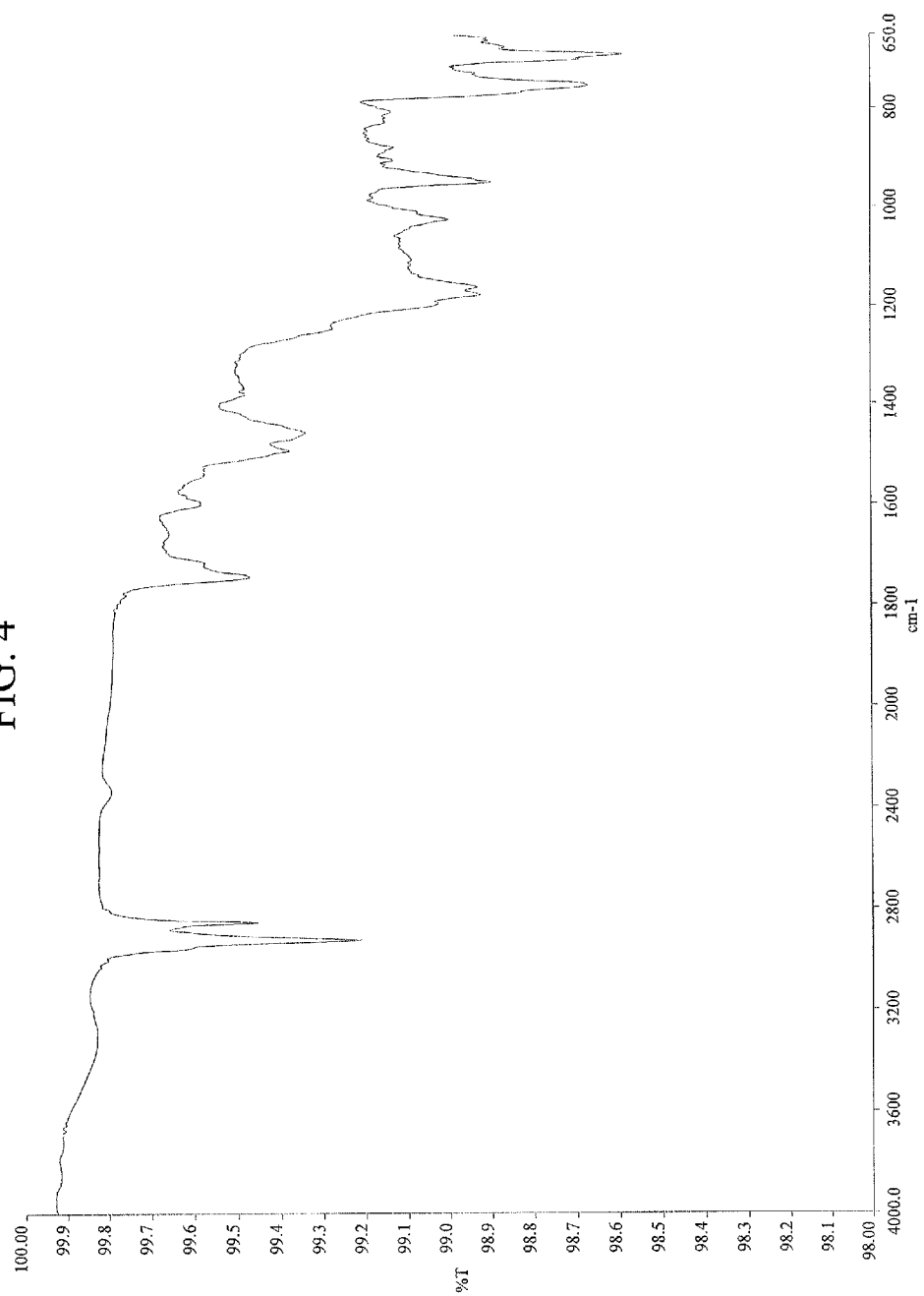
FIG. 4 shows the IR spectrum of the laminate prepared using the resin composition of Example 1.

The laminate was prepared by using the resin compositions of Examples 1 to 4 and Comparative example 1, respectively. In detail, the resin composition of one of Examples 1 to 4 and Comparative Example 1 was coated on a plurality of 7628 glass fiber cloths (resin/glass fiber cloth: 43%) by a roll coater. The coated 7628 glass fiber cloths were then placed in a dryer and dried at 180° C. for 2 to 5 minutes to prepare prepregs in a half-hardened state. Eight pieces of the prepregs were superimposed and two copper foils were respectively superimposed on the two external surfaces of the superimposed prepregs to provide a superimposed object. A hot-pressing operation was performed onto the superimposed object to provide a copper clad laminate A, wherein the hot-pressing conditions are as follows: raising the temperature to 180° C. with a heating rate of 2.0° C./min, and hot-pressing for 90 minutes under the full pressure of 15 kg/$cm^2$ (the initial pressure is 8 kg/$cm^2$) at 180° C. FIG. 4 shows the IR spectrum of the laminate prepared using the resin composition of Example 1.

The glass transition temperature (Tg), dielectric constant (Dk), dissipation factor (DO, $H_2O$ absorption, coefficient of thermal expansion (CTE), z-axis expansion (%), thermal decomposition temperature, toughness and flammability of the laminate were analyzed and the results were shown in Table 1.

TABLE 1

|  |  | Example 1 | Example 2 | Example 3 | Example 4 | Comparative example 1 |
| --- | --- | --- | --- | --- | --- | --- |
| Resin composition | phosphorus-containing epoxy resin | 100 | — | — | — | 100 |
|  | high bromine epoxy resin | — | 100 | 100 | 100 | — |
|  | melamine derivative A | 50 | 80 | 35 | 35 | — |
|  | PN | — | — | 15 | 15 | — |
|  | benzoxazine | — | — | — | — | 50 |
|  | 2E4MI | 0.1 | 0.1 | 0.1 | 0.1 | 0.1 |
|  | ATH | — | — | — | 20 | — |
|  | silane coupling agent | — | — | — | 0.2 | — |
|  | MEK | 100 | 100 | 100 | 100 | 100 |

TABLE 1-continued

| | | Example 1 | Example 2 | Example 3 | Example 4 | Comparative example 1 |
|---|---|---|---|---|---|---|
| The hot-pressing condition: raising the temperature to 180° C. with a heating rate of 2.0° C./min, and hot-pressing under a full pressure of 15 kg/cm² (the initial pressure is 8 kg/cm²) at 180° C. | | | | | | |
| The properties of the laminates | Tg (° C.) | 185 | 205 | 215 | 215 | 170 |
| | Dk (1 GHz) | 4.0 | 3.90 | 4.20 | 4.50 | 4.45 |
| | Df (1 GHz) | 0.008 | 0.005 | 0.012 | 0.008 | 0.015 |
| | H₂O absorption (%) | 0.45 | 0.25 | 0.3 | 0.3 | 0.5 |
| | CTE (ppm/° C.) | 45 | 35 | 48 | 48 | 55 |
| | z-axis expansion (%) | 3.1 | 3.0 | 3.3 | 3.1 | 3.4 |
| | thermal decomposition temperature (° C.) | 390 | 384 | 386 | 386 | 390 |
| | toughness test | good | good | good | good | good |
| | UL94 (Grade) | V-0 | V-0 | V-0 | V-0 | V-0 |

As shown in Table 1, the laminates manufactured by using the resin compositions of the present invention (Examples 1 to 4) were provided with outstanding heat resistance (e.g., a high Tg), moisture resistance (a low H₂O absorption), thermal expansion resistance (a low coefficient of thermal expansion), and electrical properties (low Dk and DO, as compared with that manufactured by using the conventional resin composition (Comparative example 1). In addition, under the same conditions, the electrical properties (Dk and DO of the laminate prepared by using the resin composition of the invention (Example 1) was obviously superior to that of the laminate prepared by using the conventional resin composition (Comparative example 1).

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A resin composition comprising:
   an epoxy resin; and
   a hardener comprising a melamine compound of Formula I:

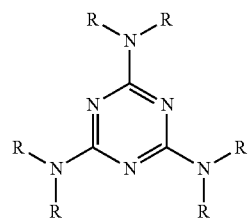

[Formula I]

wherein,

R is the same with or different from each other and has the formula of

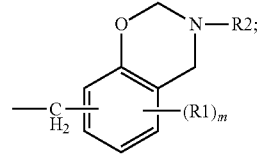

R1 is independently selected from a group consisting of H, C1-C15 alkyl optionally substituted by an alkyl or alkoxy, C1-C15 alkoxy optionally substituted by an alkyl or alkoxy, C3-C15 cycloalkyl optionally substituted by an alkyl or alkoxy, C6-C20 aryl optionally substituted by an alkyl or alkoxy, C6-C20 aryloxy optionally substituted by an alkyl or alkoxy, and a dicyclopentadiene group;

R2 is selected from a group consisting of C1-C15 alkyl optionally substituted by an alkyl or alkoxy, C1-C15 alkoxy optionally substituted by an alkyl or alkoxy, C3-C15 cycloalkyl optionally substituted by an alkyl or alkoxy, C6-C20 aryl optionally substituted by an alkyl or alkoxy, C6-C20 aryloxy optionally substituted by an alkyl or alkoxy and a dicyclopentadiene group; and m is 1 or 2, wherein the amount of the hardener is about 20 parts by weight to about 150 parts by weight per 100 parts by weight of the epoxy resin.

2. The resin composition of claim 1, wherein R1 and R2 are independently C6-C20 aryl optionally substituted by an alkyl or alkoxy, C6-C20 aryloxy optionally substituted by an alkyl or alkoxy or a dicyclopentadiene group.

3. The resin composition of claim 1, wherein R1 is H and R2 is a phenyl group optionally substituted by an alkyl or alkoxy.

4. The resin composition of claim 1, wherein the amount of the hardener is about 40 parts by weight to about 90 parts by weight per 100 parts by weight of the epoxy resins.

5. The resin composition of claim 1, wherein the hardener comprises dicyandiamide (Dicy), 4,4'-diaminodiphenyl sulfone (DDS) or phenol formaldehyde (PF).

6. The resin composition of claim 1, which further comprises a hardening promoter, a filler, a dispersing agent, a flexibilizer, a retardant or any combinations thereof.

7. The resin composition of claim 6, wherein the hardening promoter is selected from a group consisting of 2-methyl-imidazole (2MI), 2-ethyl-4-methyl-imidazole (2E4MI), 2-phenyl-imidazole (2PI) and combinations thereof, wherein the amount of the hardening promoter is about 0.01 parts by weight to about 1 part by weight per 100 parts by weight of the epoxy resin.

8. The resin composition of claim 6, wherein the filler is selected from a group consisting of silicon dioxide, glass powder, talcum, kaolin, mica and combinations thereof, wherein the amount of the filler is about 0.1 parts by weight to about 80 parts by weight per 100 parts by weight of the epoxy resin.

9. A prepreg, which is prepared by immersing a reinforcing material into the composition of claim 1 and drying the immersed reinforcing material.

10. A laminate comprising a synthetic layer and a metal layer, wherein the synthetic layer is made from the prepreg of claim 9.

* * * * *